United States Patent [19]

Barnea et al.

[11] Patent Number: 4,825,161
[45] Date of Patent: Apr. 25, 1989

[54] NOISE REDUCTION IN MAGNETIC RESONANCE IMAGES

[75] Inventors: Daniel Barnea, Tel Aviv; Saul Stokar, Ra'Anana; Yuval Zur, Herzlia, all of Israel; Noam Kaplan, Vancouver, Canada; Amir Ban, Tel Aviv, Israel

[73] Assignee: Elscint Ltd., Haifa, Israel

[21] Appl. No.: 119,483

[22] Filed: Nov. 12, 1987

[30] Foreign Application Priority Data

Nov. 21, 1986 [IL] Israel .......................................... 80727

[51] Int. Cl.⁴ ........................................... G01R 33/20
[52] U.S. Cl. ..................................... 324/309; 324/307
[58] Field of Search ............... 324/300, 307, 311, 312, 324/309; 128/653

[56] References Cited

U.S. PATENT DOCUMENTS

| | | | |
|---|---|---|---|
| 4,315,216 | 2/1982 | Clow | 324/309 |
| 4,532,474 | 7/1985 | Edelstein | 324/309 |
| 4,579,121 | 4/1986 | Macovski | 324/309 |
| 4,591,789 | 5/1986 | Glover | 324/307 |
| 4,651,096 | 3/1987 | Buonocore | 324/307 |

OTHER PUBLICATIONS

Article entitled "An Analysis of Noise Propogation in Computed T2, Pseudodensity and Synthetic Spin-Echo Images" by James R. MacFall et al., published in the Medical Physics Journal, vol. 13, at pp. 285–292 in May/Jun. 1986.

Primary Examiner—Michael J. Tokar
Attorney, Agent, or Firm—Sandler & Greenblum

[57] ABSTRACT

Improved T2 values and signal to noise ratio obtained by magnetic resonance image synthesization. Each measured echo signal intensity is divided by a correcting factor that is a function of the echo number to obtain corrected echo signal intensity. A characteristic curve is best fitted to the corrected intensity values and the intensity values of the curve are used.

20 Claims, 3 Drawing Sheets

NOISE REDUCTION IN MAGNETIC RESONANCE IMAGES

FIELD OF THE INVENTION

This invention is concerned with magnetic resonance (MR) systems such as magnetic resonance imaging (MRI) or spectroscopy (MRS) systems. More particularly this invention is concerned with improving signal to noise ratio (SNR) in such systems; especially, when using echo procedures for obtaining data.

BACKGROUND OF THE INVENTION

The usable signals obtained by MR systems are extremely small. The signals from the systems are derived when nuclei that are aligned by a strong static magnetic field are perturbed by a pulse or pulses comprising a magnetic field rotating at a radio frequency (RF). After the termination of the RF pulse or pulses the perturbed nuclear magnetization precesses at the resonant frequency and tends to return to the unperturbed orientation. During the reverting process, the precessing nuclear magnetizatiion transmits a signal, albeit small, that is detected and used for spectroscopy or imaging; for example. For imaging purposes gradient magnetic fields are also used for locating the source of the signal—that is the location of the precessing and reverting perturbed nuclei in the subject being imaged.

The inherent low amplitude of the signal increases the importance of improving the SNR. Accordingly, scientists in the field are continuously searching for ways and means of improving the SNR of the received signals.

One of the more popular methods of acquiring data for imaging is through the utilization of echos. For example, there is a scan sequence that is known as the "Spin Echo" sequence. In that scan sequence, first a 90 degree RF pulse is applied to the subject simultaneously with the application of a selection gradient pulse. The 90 degree RF pulse perturbs the aligned nuclei in the subject by 90 degress to move the nuclei to a plane (such as X—Y) that is perpendicular to the axis (Z) of the strong static magnetic field. (X,Y,Z are the so called "rotating" Cartesian Coordinates normally used to define MR systems.) After a certain defined time period a second RF pulse is applied, designed to further perturb the already perturbed nuclei 180 degrees in the same plane (X—Y).

The 180 degree RF pulse reverses the planar movement of the perturbed nuclei. The nuclei when first perturbed to the X—Y plane are substantially all aligned; however, they tend to spread or disburse in the X—Y plane and rotate around the Z axis at different speeds and in different directions, i.e. clockwise and counter clockwise because of such things as the inhomogeneity of the strong static magnetic field.

At any rate, certain nuclei rotate faster than other of the nuclei and hence move further from the originally perturbed position in the X—Y plane. When the 180 degree RF pulse is applied, the nuclei are moved 180 degrees in the X—Y plane so that all of the nuclei are moving towards realignment, 180 degrees from the original aligned position in the X—Y plane. Since the nuclei that are furthest from the original aligned position in the X—Y plane are the fastest moving nuclei it is apparent that the nuclei will again substantially all realign. As a matter of fact the realignment occurs at a time equal to the time difference between the application of the 90 degrees pulse and the 180 pulse. The realignment causes a relatively strong signal known as an "echo".

Multiple echoes are obtained by applying multiple 180 degree pulses. Each subsequent echo signal is slightly smaller than the previous echo signal, and the difference in size is a good estimate of the decay or relaxation time T2.

There are other ways of generating the echo signals which are well known to those skilled in the art. The echo signals are used to provide images of a subject. Magnetic gradients as mentioned before are used to locate the source of the echo signals based upon the Larmor equation, which is:

$$f = \gamma Bo/2\pi.$$

Where:
f is the frequency of the received signal;
$\gamma$ is the gyro magnetic constant based on the nuclear isotope from which the echo is received;
Bo is the magnetic intensity of the field at the point from which the echo is received; and
$\pi$ is the constant 3.1416.

The echo signals are very small as are all of the free induction (FID) signals. Thus, any means for improving the SNR is worthwhile.

Synthesization has been suggested as a means of improving the SNRr. For example, an article entitled "An analysis of Noise Propogation in Computed T2, Pseudo-density and Synthetic Spin-echo Images" by James R. MacFall et al published in the Medical Physics Journal, Volume 13, at PP 285-292 in May/June 1986 alludes to the fact that under many circumstances a signal synthesized at some echo time can have an SNR superior to that of a directly acquired signal. As described in the article, the synthesis of spin-echo signals assumes a model wherein;

$$Si = PDe^{-TEi/T2}$$

where:
si is a set of spin echo signals;
i is a number from 1 to N;
PD is the pseudo-density incorporating the nuclear density and all T1 (longitudinal or spin-lattice relaxation time) related items;
TEi is the set of echo times used in obtaining the set Si; and
T2 is the transverse relaxation time.

The basic reason for synthesizing as described in the article is to obtain the value of T2 and a multiplicity of values of PD after measuring only a few values of Si at different echo times. The synthesis is accomplished by fitting a curve to the measured values (more than two) to provide further values of the pseudo-density and the relaxation time T2. Thus through synthesization, selected points in a matrix are obtained by actual measurements. More measurements are taken than there are unknowns. Therefore, methods such as least square fitting can be used for extrapolating and interpolating the measured points to obtain virtual images at TE values for which no actual measurements were taken.

It is noted in the previously mentioned article that image synthesization might in certain cases, improve the SNR of said virtual images. However, synthesization does not provide a really accurate T2 time. Accordingly although the image synthesization process provides a relatively noise free image, it does not provide a truly correct image.

The reason for the incorrect image is, among other things, that the values of T2 obtained by synthesization fails to take into account the actual slice profile. Accordingly, synthesized images contain errors because among other things of the differences in the actual slice profile and the ideal slice profile.

Accordingly, it is an object of the present invention to make corrections, in general, on the T2 values obtained using MR echo procedures.

It is a further object of the present invention to utilize the method of correcting the T2 time along with image synthesization in order to obtain images with improved SNR and having true T2 values, and then for example to enable replacement of the originally acquired set of images with a new set of images having improved fidelity; i.e., closer to an ideal set.

BRIEF DESCRIPTION OF THE INVENTION

According to a broad aspect of the present invention, a method of improving the SNR in MR systems is provided; said method comprising the steps of:

measuring intensity values of echo signals after at least three echo times (TE);

dividing each of the measuring intensity values by a correcting factor that is a function of the echo number to obtain corrected intensity values;

best fitting a characteristic curve to the corrected intensity values to obtain new corrected intensity values having improved SNRs at any desired place along the best fitted characteristic curve, and using the new intensity values.

Another broad object of the present invention is to provide a method of correcting the T2 time obtained during an MR pulse sequence; said method comprising the steps of:

using an echo generating scan sequence;

measuring the amplitude of a plurality of echoes;

dividing each of the measured amplitude values by a correcting factor CFi that is a function of the echo number, i, to obtain corrected echo amplitudes; and determining a true T2 value from said corrected amplitude values.

The present invention further includes:

performing multi echo acquisition with n echoes;

acquiring data from at least a single slice having a slice thickness H, said slice preferably being perpendicular to any given axis of the MR system, but without loss of generality, the following description is drawn to an example in which said slice is assumed to be perpendicular to the Z axis specifically, forming a set of pixel intensities Ii for each pixel position in the image; where i is the echo number equal to 1,2, ... n, and obtaining new intensity values by synthesization from said measured amplitude values.

The method further includes correcting the pixel intensities and obtaining a corrected pixel intensity set: $Pi = Ii/CFi$ where: $i = 1, 2, \ldots n$ (in a preferred embodiment $n=8$). The correction factor per pixel at the ith echo is given by:

$$CFi = \int_{-\infty}^{+\infty} [\sin^2\theta^{120}(Z)/2]^i \cdot \sin^{90}(Z) \cdot dz /$$

-continued
$$\int_{-\infty}^{+\infty} \sin^2\theta^{180}(Z)/2)^i \sin\theta^{90}(Z) \cdot dz$$

where: $\theta(Z)$ is the angle through which the nuclei are perturbed by the 90 degree or the 180 degree R.F. pulses, and $$\cos\theta(Z)^{90,180} = Mz(Z)^{90,180}$$

where: Mz (Z) is the Z component of the magnetization $\vec{M}(Z)^{90,180}$ which is obtained by solving numerically for $\vec{M}$ across the slice (i.e.) along Z in the Bloch Equation:

$$\Delta\vec{M} = \vec{M} \times \vec{B}(Z) \cdot \Delta t \cdot \gamma$$

where: the initial conditions (t=0) are $\vec{M}(X)=0$, $\vec{M}(Y)=0$ and $\vec{M}(Z)=1$
with $B(Z)^{90,180}$ being the effective magnetic field acting on the nuclei at the Z plane of a voxel containing the said pixels during the 90, 180 degree RF pulses respectively. B(Z) is expressed in terms of the rotating frame coordinate system referred to in the "Background of the Invention" section above. (also see e.g. "the Priciples of Nuclear Magnetization", by A. Abragam published by the Oxford U. Press (1961)).

BRIEF DESCRIPTION OF THE DRAWINGS

The above named and other objects and features of the present invention will be better understood by reference to the following detailed description of a broad aspect of the invention when considered in connection with the accompany drawings; wherein.

GENERAL DESCRIPTION

Figure 1:
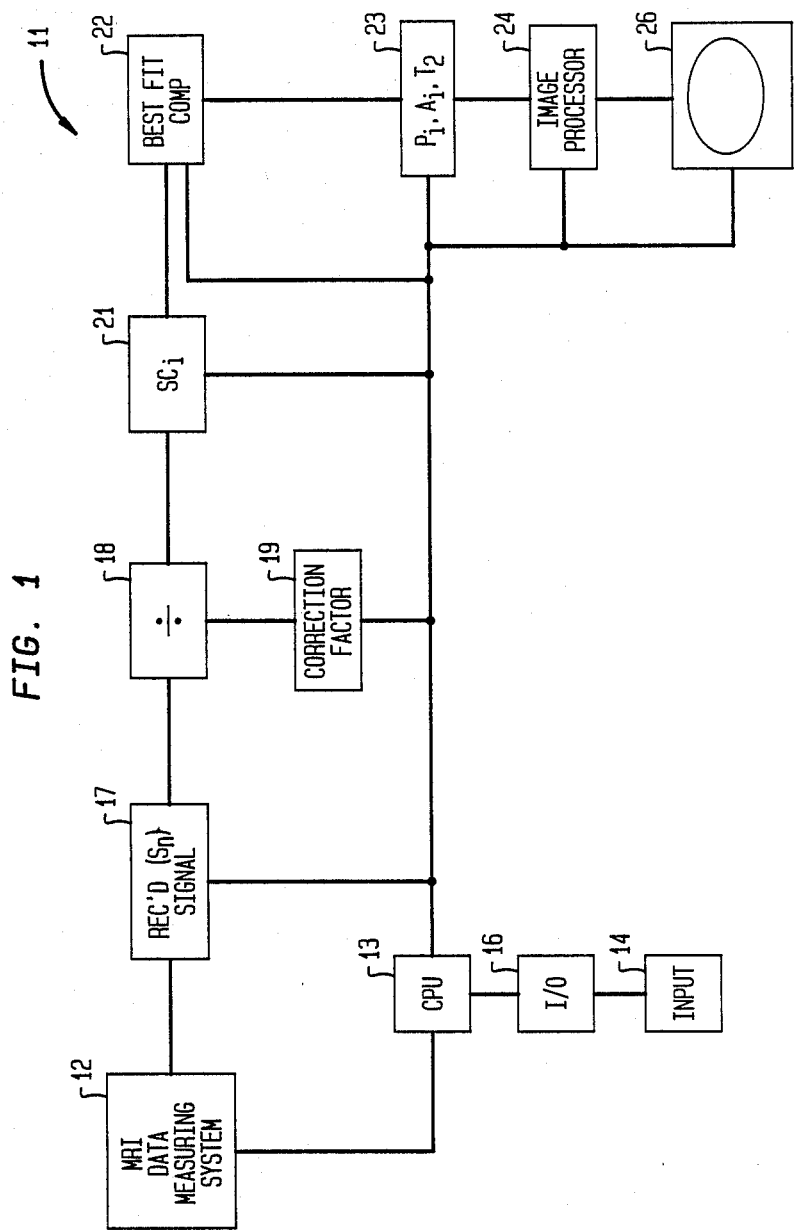
FIG. 1 is a block diagram showing of an MRI system using the invention.

FIG. 1 at 11 shows an MRI data acquisition and processing system particularly useful for obtaining the true images with improved SNR. Block 12 represents an MRI data acquisition system. Such data is acquired in a preferred embodiment using a superconducting magnet to provide a large relatively homogeneous magnetic field with associated gradient coils and RF transmitting and receiving coils. The system is under the control of a central processing unit (CPU) 13 which enables among other things input by a user as indicated at input 14. Input 14 is attached to CPU 13 through an interfacing unit (I/O) 16. The CPU is connected to and controls the system.

The received signals Si, indicated at 17, are the FID signals or echo signals commonly used in magnetic resonance system for either spectroscopy or imaging purposes. In the case of the use of this system for SNR improvement, then particular emphasis is given to the scan sequences that provide echo signals. The "i" of the signals Si indicates the number of the echo, from 1,2 .. . n. The received signals Si are connected to a divide unit 18 where they are divided by a correction factor CF1 provided by unit 19. This system and method can be used in conjunction with more sophisticated scan procedures such as (but not limited to) multi-slice imaging or fast scan imaging within the scope of the invention.

The output of divider unit 18 are the corrected signals Sci as shown at 21. The corrected signals are then operated on by a best fit computer 22 to provide the best fit image data indicated as Pi—where Pi-is the intensity of the signal after the correction and after the application of the best fit procedure.

The output from unit 22 also includes the values Ai and T2—where Ai is a composite value made up of such intrinsic parameters as the magnetization, the relaxation time T1 and the transverse relaxation time T2.

Inputted into the I/O unit 16 through input unit 14 may be such extrinsic values as the repetition rate TR and the echo times TEi. In other words the operator controls the repetition rate and/or the echo times with controls applied at 14. In actual practice $Pi = Aie^{-TEi/Td}$ where Td, in a perfectly homogeneous environment is the monoexponential relaxation time T2.

The best fit computer (22) first obtains the values Ai and T2. From these values with the known echo times (TEi), the value of Pi are computed. The Pi values are used by placing them in the image processor matrix from which the image is constructed.

The output of the best fit computer 22 is shown at block 23. It provides among other things input to the image processor 24 which provides the image on the display unit 26. In the past, the synthesized images were made relativley noise free but did not give the true image values, and therefore were really not of much use to the diagnostician or the physician.

As is well known, the original received signals, Si indicated at 17 are not accurate because of errors such as those due to the shape of the slice profile. Theoretically; the slice profile should be a rectangle. In actual practice it differs from the rectangle. To correct for this, correction factors from unit 19 are used as divisors with the received signals Si being the dividends.

There are several ways to obtain the necessary correction factors, and once these are obtained and made available as output in unit 19, the computation proceeds as described above.

Figure 2:
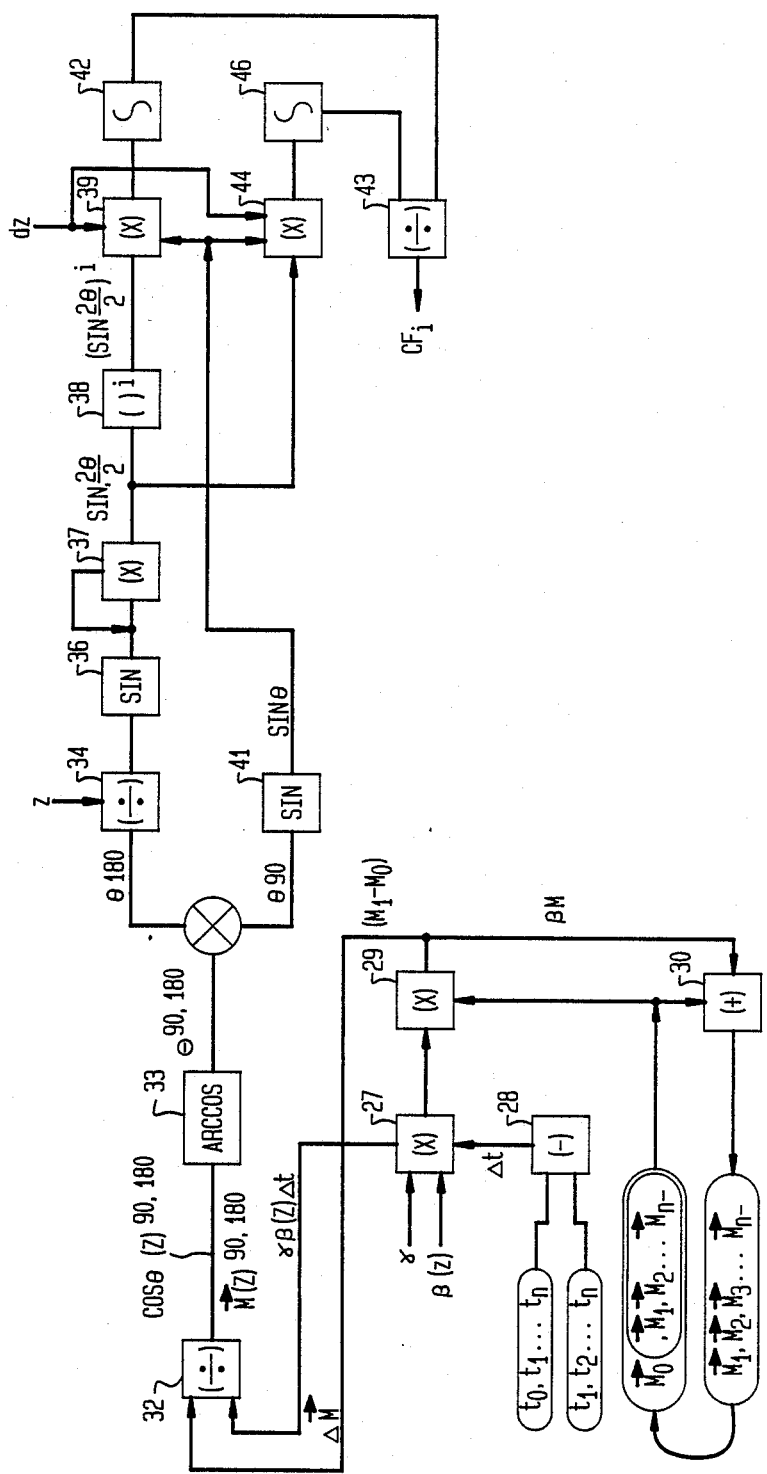
FIG. 2 is a block diagram showing details of block 19 of FIG. 1.

FIG. 2 shows details of one particular derivation of the correction factors CFi of block 19.

Therein a multiplying unit 27 is provided with three inputs. They are the gyromagnetic constant for the element being imaged, $B(Z)^{90,180}$ the effective magnetic field on the nuclei in the X—Y plane of the voxel producing the pixel values during the 90 degree and the 180 degree RF pulses, and $\Delta t$. The value of $\Delta t$ is obtained by subtracting time "to", from time "t1" in the first step, and time "t1" from time "t2" in the second step, etc. The differences are obtained from subtraction unit 28. In one embodiment time differences of 10 microseconds are used.

The output product $\gamma \cdot \Delta t \cdot B(Z)$ from block 27 is multiplied in multiplication unit 29 first by $\vec{M}o$, the original magnetization vector and subsequently by $\vec{M}1, \vec{M}2 \ldots \vec{M}n$, the magnetization vectors related to the time differences. The product output of unit 29 is $\Delta M$ which is used as a dividend input to divide unit 32. The divisor input $\gamma \cdot \Delta t \cdot B(Z)$ is obtained from multiplication unit 27.

The output $\Delta M$ of unit 29 is added in unit 30 to the values Mo, M1 ... Mn to provide the values M1, M2, M3, ... Mn which are sequentially used as inputs to units 29 and 30 after the original input Mo has been used.

The output of the divide unit 32 is $\cos \theta(Z)^{90,180}$. The value of $\theta$ is determined by taking the arc cosine of the $\cos \theta$ as indicated at block 33. The angle 0 is then divided by 2 as shown at block 34 and $\sin \theta/2$ is computed at block 36. The value of $\sin \theta/2$ is multiplied by itself as shown at block 37 to provide $\sin 0/2$. This is done both for the 90 degree pulse and 180 degree pulses. The output, that is $\sin^2 \theta/2$ is then raised to the "ith" power, where i is the echo number. The multiplication for the raising of the sin $(\theta/2)$ to the "ith" power is indicated at block 38.

The output of block 38 is then multiplied by dZ in multiplication unit 39. The multiplication unit 39 has another input for $\sin 0$ as indicated at block 41. The output of the block 41 is then coupled to unit 39. The output of unit 39 is intergrated as indicated at the block 42. The output of the integrator block 42 is connected to divide unit 43 as the divident.

The divisor is obtained by multiplying $\sin^2(\theta/2)$ by $\sin \theta$ and by the dz value as indicated at block 44 and integrating as indicated at block 46. The output of block 43 is the correction factor CFi.

The correction factor may be used for many purposes but as described herein it is used to improve image synthesization by using corrected measured amplitude signals. The improved synthesization procedure provides not only a relatively noise free image but also an image that provides true image intensity values.

It should be understood that while hardware has been described herein for providing and using the correction factors CFi, software or combinations of hardware and software could be used for such purposes. In a preferred embodiment software is used. There are other methods of finding correction factors within the scope of the invention. For example, the CFi can also be derived empirically utilizing phantoms with known T2 and Ai values.

Figure 3:
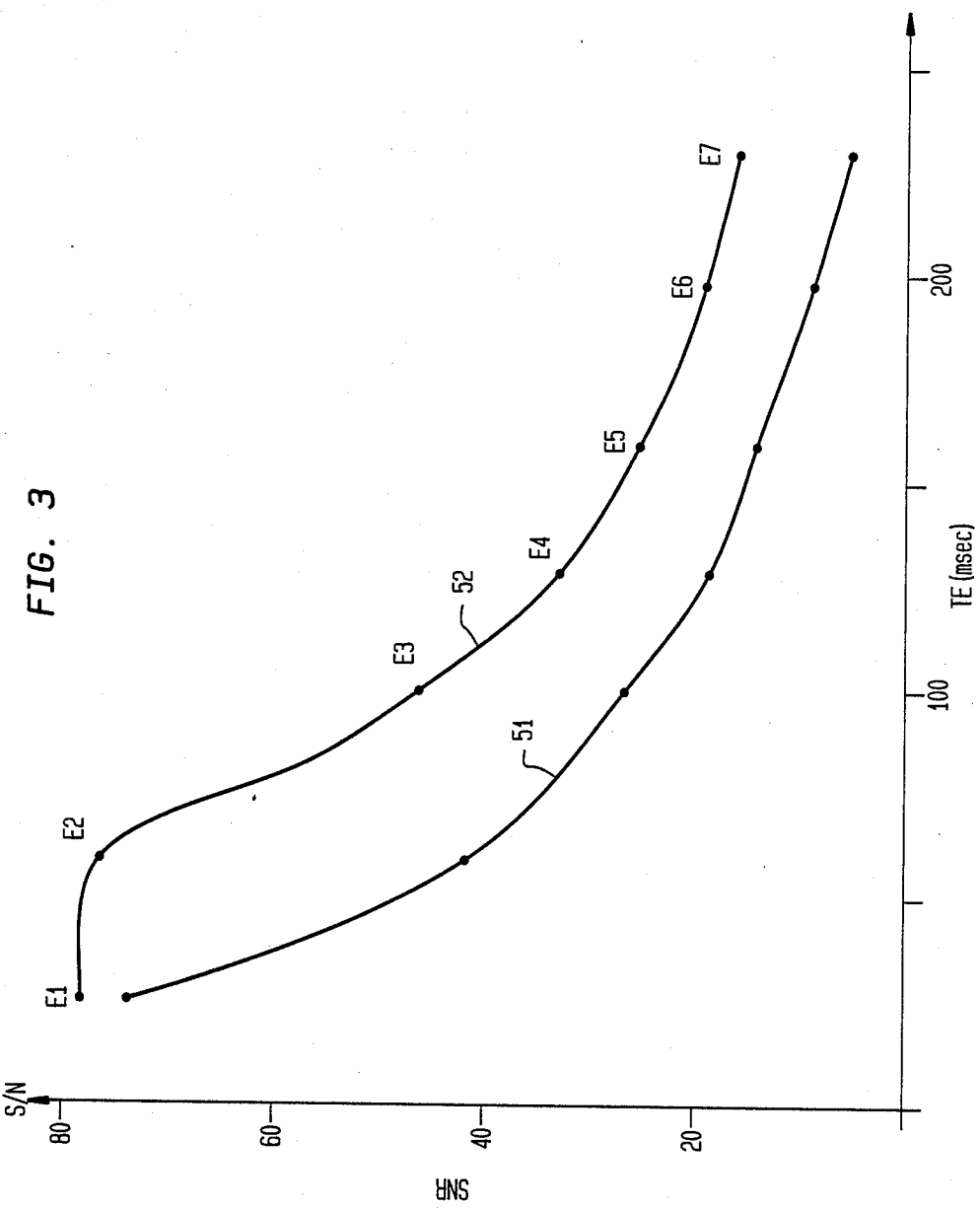
FIG. 3 is a graphical showing of the improvement in SNR achieved using the inventive method.

The improvement in the signal to noise ratio is shown in the graph of FIG. 3 which is a graph of the SNR vs echo delay time TE. The time T is proportional to the echo number. As shown in FIG. 3, even at the first echo, the corrected SNR is significantly improved as compared with the "conventional" SNR. Subsequently, the difference between the SNR corrected and uncorrected is dramatic. The SNR in the output as with uncorrected values is shown at 51. The corrected SNR of the output is shown at 52.

The invention thus provides a means for correcting for errors such as those caused by the differences between the ideal slice profile and the actual slice profile. The difference effects the apparent relaxation time T2 in particular. The differences in the profile are caused by the inhomogeneities in the field, the complicated algorithms, and the actual input RF signal discrepancies as compared to the ideal input RF signal. In fact presently there is no known method of obtaining a square output profile. In fact many scientists believe a square output profile will never be achieved.

In the particular use emphasized herein, the received signal corrected using the correction factor is for use with image synthesization processes, whereby a received image is processed and synthesized so that not only is an image with an improved SNR provided but in addition the resulting image is free from bias or errors due to the slicing process.

While the invention has been described in relation to particular embodiments it should be understood that the described embodiments are made by way of example only and not as limitations of the scope of the invention, which is defined in the following claims:

What is claimed is:

1. A method of improving signal-to-noise-ratio in magnetic resonance (MR) systems, said method comprising the steps of:

measuring intensity values of at least three sequential echoes, correcting the measured intensity values by operating on each of the measured intensity values with a correcting factor to obtain corrected measured intensity values, said correcting factors correcting for differences between an actual slice profile and an ideal slice profile, using said corrected measured intensity values to obtain a set of corrected intensity values having improved SNR characteristics, and using the set of corrected intensity values to obtain images.

2. The method of claim 1 wherein the step of using said corrected measured intensity values comprises fitting a characteristic curve based on a desired model to the corrected measured intensity values.

3. The method of claim 2 wherein said desired model is the curve characterized by the Equation:

$$Si = PDe^{-TEi/T2}$$

where:

Si is a set of spin echo signals;

i is a number from 1 to N;

PD is the pseudo-density incorporating the nuclear density and all T1 (longitudinal or spin-lattice relaxation time) related items;

TEi is the set of echo times used in obtaining the set Si of spin echo signals; and T2 is the transverse relaxation time.

4. The method of claim 1 wherein said step of measuring intensity values includes the steps of:

acquiring data from at least a single slice, said slice preferably being perpendicular to the Z axis of the Mr system and being divided into unit areas corresponding to pixels of said images;

forming a set of intensity values, for each pixel position of said unit areas in the image where i is the echo number equal to 1,2 ... m, and obtaining new intensity values by synthesization from said measured intensity values.

5. The method of claim 4 wherein said correcting step includes the step of obtaining a corrected intensity set $Pi = Ii/CFi$ where i equal 1,2, ... n.

6. The method of claim 5 wherein:

$$CFi = \int_{-\infty}^{+\infty} [\sin^2(\theta^{180}(Z)/2)]^i \cdot \sin\theta^{90}(Z)dz /$$

$$\int_{-\infty}^{+\infty} \sin(\theta^{180}(Z)/2) \cdot \sin\theta^{90}(Z) \cdot dz$$

where:

CFi is the correction factor;

(Z) is the angle through which the nuclei are perturbed by the 90 degree or the 180 degree Rf pulses, and $\cos\theta(Z)^{90,180} = Mz(Z)^{90,180}$;

$Mz(Z)^{90,180}$ is the Z component of the magnetization $\vec{M}(Z)^{90,180}$ which is obtained by solving numerically for $\vec{M}$ across the slice i.e. along Z in the Bloch equation:

$$\Delta\vec{M} = \vec{M} \times \vec{B}(Z)\gamma \cdot \Delta T$$

where: the initial conditions (t=0) are $\vec{M}(X)=0, \vec{M}(Y)=0$ and $\vec{M}(Z)=1$ with: B(Z) being the effective magnetic field acting on the nuclei at the Z plane of the voxel containing the said pixels during the 90 degree and 180 degree Rf pulses, respectively.

7. A method of improving signal to noise ratio in magnetic resonance (MR) systems, said method comprising the steps of:

subjecting a subject to a large static magnetic field;

applying a 90 degree radio frequency (RF) pulse rotating at the Larmor frequency;

applying a selecting gradient pulse during the application of the 90 degree RF pulse, applying a phase encoding pulse after the application of the 90 degree RF pulse, applying a 180 degree RF pulse during the application of another selecting pulse;

applying a read gradient pulse;

receiving a first echo signal during the application of the read gradient pulse at a time γ2 after the application of the 180 degree RF pulse equal to the time γ1 between the application of the 90 degree RF pulse and the 180 degree RF pulse, applying another 180 degree RF pulse during the application of another selecting gradient pulse, receiving a second echo pulse during the application of another read gradient pulse, applying still another 180 degree RF pulse during the application of still another gradient selecting pulse;

receiving a third echo signal during the application of yet another read gradient;

measuring the intensity values of the echo signals;

dividing each of the measured intensity values by a correcting factor correcting for the errors caused by differences between an actual slice profile and an ideal slice profile to obtain corrected intensity values, best fitting a characteristic curve to the corrected intensity values to obtain a set of corrected intensity values taken from desired places along the best fitted characteristic curve, and using said set of corrected intensity values.

8. The method of claim 7 wherein the set of corrected intensity values is used for obtaining corrected values of T2.

9. The method of claim 7 wherein the set of corrected intensity values is used for obtaining a corrected image.

10. The method of claim 9 wherein said correction factor is obtained by using the following steps;

multiplying γ, the gyromagnetic constant based on the nuclei from which the echoes are received by B(Z), the effective magnetic field acting on the nuclei at the Z plane of a voxel containing the pixels during the application of the 90 and 180 degree RF pulses to obtain a first product (γ·B(Z)), multiplying the first product by Δt where Δt initially is t1−t0 to obtain a second product (γ·B(Z)·Δt), obtaining the vector cross product of the second product and the initial vector component of magnetization $\vec{Mo}$ and subsequently sequential vector components $\vec{M1}, \vec{M2} ... \vec{Mn}$, dividing the vector cross product by the second product to obtain cos (Z);

determining the value of θ obtained responsive to the 90 degree pulses and the 180 degree pulses from the cos $\theta(Z)^{90,180}$, dividing Θ by 2, taking the sin of $\theta/2$;

squaring the sin $\theta/2$;

raising the squared value to the power i;

multiplying the squared value raised to the power i by sin $\theta$ and by d(Z) to obtain a third product;

integrating the third product from $+\infty$ to $-\infty$ to obtain a first integral; and dividing the first integral by the integral of the product of $(\sin^2\theta/2)^{180}$ and $\sin\theta \cdot d(X)^{90}$ to obtain the correction factor.

11. An arrangement for improving signal-to-noise ratio in magnetic resonance (MR) systems, said arrangement comprising:

means for measuring intensity values of at least three sequential echoes, correcting means for operating on each of the measured intensity values with a correcting factor to obtain corrected measured intensity values, said correcting factors correcting for differences between a natural slice profile and an ideal slice profile, means for using said corrected measured intensity values to obtain a set of corrected intensity values having improved SNR characteristics, and means for using the set of corrected intensity values to obtain images.

12. The arrangement of claim 11 wherein the means for using said corrected measured intensity values comprises means for fitting a characteristic curve based on a desired model to the corrected measured intensity values.

13. The arrangement of claim 12 wherein said desired model is the curve characterized by the Equation:

$$Si = PDe^{-TEi/T2}$$

where:

Si is a set of spin echo signals;

i is a number from 1 to N;

PD is the pseudo-density incorporating the nuclear density and all T1 (longitudinal or spin-lattice relaxation time) related items;

TEi is the set of echo times used in obtaining the set Si of spin echo signals; and T2 is the transverse relaxation time.

14. The arrangement of claim 11 wherein said means for measuring intensity values includes:

means for acquiring data from at least a single slice, said slice preferably being perpendicular to the Z axis of the MR system and being divided into unit areas corresponding to pixels of said images;

means for forming a set of intensity values with an intensity value for each unit area position where i is the echo number equal to 1,2 ... n; and means for obtaining intensity values by synthesization from said measured intensity values.

15. The arrangement of claim 14 wherein said correcting means includes means for obtaining a corrected intensity set $Pi = Ii/CFi$ where i equal 1,2, ... n.

16. The arrangement of claim 15 wherein:

$$CFi = \int_{-\infty}^{\infty} [\sin^2(\theta^{180}(Z)/2)]^i \cdot \sin\theta^{90}(Z)dz /$$

$$\int_{-\infty}^{\infty} \sin(\theta^{180}(Z)/2) \cdot \sin\theta^{90}(Z) \cdot dz$$

where:

CFi is the correction factor;

(Z) is the angle through which the nuclei are perturbed by the 90 degree or the 180 degree Rf pulses, and $\cos\theta(Z)^{90,180} = Mz(Z)^{90,180}$;

$Mz(Z)^{90,180}$ is the Z component of the magnetization $\vec{M}(Z)$ which is obtained by solving numerically for $\vec{M}$ across the slice i.e. along Z in the Bloch equation:

$$\vec{M} = \vec{M} \times \vec{B}(Z) \cdot \gamma \cdot \Delta t$$

where: the initial conditions (t=0) are $\vec{M}(X)=0$, $\vec{M}(Y)=0$ and $\vec{M}(Z)=1$ with: B(Z) being the effective magnetic field acting on the nuclei at the Z plane of the voxel containing the said pixels during the 90 degree and 180 degree Rf pulses, respectively.

17. An arrangement for improving signal to noise ratio is magnetic resonance (MR) systems, said method comprising:

means for subjecting a subject to a large static magnetic field;

means for applying a 90 degree radio frequency (RF) pulse rotating at the Larmor frequency;

means for applying a selecting gradient pulse during the application of the 90 degree RF pulse, means for applying a phase encoding pulse after the application of the 90 degree RF pulse, means for applying a 180 degree pulse during the application of another selecting pulse;

means for applying a read gradient pulse;

means for receiving a first echo signal during the application of the read gradient pulse at a time γ2 after the application of the 180 degree RF pulse equal to the time γ1 between the application of the 90 degree Rf pulse and the 180 degree RF pulse;

means for applying another 180 degree RF pulse during the application of another selecting gradient pulse, means for receiving a second echo pulse during the application of another read gradient pulse, means for applying still another 180 degree RF pulse during the application of still another gradient selecting pulse;

means for receiving a third echo signal during the application of yet another read gradient;

means for measuring the intensity values of the echo signals;

means for dividing each of the measured intensity values by a correcting factor correcting for the errors caused by differences between an actual slice profile and an ideal slice profile to obtain corrected intensity values, means for best fitting a characteristic curve to the corrected intensity values to obtain a set of corrected intensity values taken from desired places along the best fitted characteristic curve, and means for using said set of corrected intensity values.

18. The arrangement of claim 17 wherein means are provided for using the set of corrected intensity values for obtaining corrected values of T2.

19. The arrangement of claim 17 wherein means are provided for using the set of corrected intensity values for obtaining a corrected image.

20. The arrangement of claim 19 wherein said means correction factor is obtained by using the following steps:
- means for multiplying $\gamma$, the gyromagnetic constant based on the nuclei from which the echoes are received by B(Z), the effective magnetic field acting on the nuclei at the Z plane of a voxel containing the said pixels during the application of the 90 degree and 180 degree RF pulses to obtain a first produce ($\gamma \cdot B(Z)$),
- means for multiplying the first product by t where t initially is (t1−t0) and subsequently is sequentially (t2−t1), (t3−t2) ... (tn−tn−1) to obtain a second product ($\gamma \cdot BZ \cdot \Delta t$),
- means for obtaining the vector cross product of the second product and the initial vector component of magnetization Mo and subsequently sequential vector components M1, M2 ... Mn;
- means for dividing the vector cross product by the second product to obtain $\cos \theta(Z)$;
- means for determining the value of $\theta$ obtained responsive to 90 degree pulse and 180 degree pulses from the $\cos \theta$;
- means for dividing $\theta$ by 2,
- means for taking the sin of $\theta/2$;
- means for squaring $\sin \theta/2$;
- means for raising the squared value to the power i,
- means for multiplying the squared value raised to the power i by $\sin \theta$ and by d(Z) to obtain a third product;
- means for integrating the third product from $+\infty$ to $-\infty$ to obtain a first integral; and
- means for dividing the first integral by the integral of the product of $\sin^2(\theta/2)^{180}$ and $\sin \theta \cdot d(Z)^{90}$ to obtain the correction factor.

* * * * *